US005185499A

United States Patent [19]

Yahraus

[11] Patent Number: 5,185,499

[45] Date of Patent: Feb. 9, 1993

[54] RECEPTACLE BOX

[76] Inventor: Norman J. Yahraus, 2240 Lindell Rd., Las Vegas, Nev. 89102

[21] Appl. No.: 563,759

[22] Filed: Aug. 7, 1990

[51] Int. Cl.[5] ............ H05K 5/02

[52] U.S. Cl. ............ 174/65 R; 174/92; 220/4.02

[58] Field of Search ............ 174/65 R, 53, 92; 220/3.92, 3.94, 4.02

[56] References Cited

U.S. PATENT DOCUMENTS

| | | | |
|---|---|---|---|
| 1,857,787 | 5/1932 | Meeks et al. | 220/3.92 X |
| 2,552,400 | 5/1951 | Brunia | 220/4 |
| 2,639,054 | 5/1953 | Austin, Jr. | 220/3.92 |
| 2,881,940 | 4/1959 | Hamilton | 220/3.94 |
| 3,728,470 | 4/1973 | Maier | 174/58 |
| 4,382,649 | 5/1983 | Meyer | 174/65 R X |
| 4,449,015 | 5/1984 | Hotchkiss | 174/65 R X |
| 4,818,822 | 4/1989 | Yahraus | 174/53 |

*Primary Examiner*—Leo P. Picard
*Assistant Examiner*—David Tone
*Attorney, Agent, or Firm*—Richard G. Harrer

[57] ABSTRACT

An improved electrical receptacle box having resealable openings and adapted to enclose an electrical apparatus such as a five-wire receptacle. The box is made up of two sections which are preferably identical. Each resealable opening is provided wth a channel about its periphery. The electrical apparatus is provided with a flange about its periphery and this flange is engaged in the channel of the box opening to ensure that the apparatus is securely mounted within the box. Planar seals are provided which can be inserted into the channel of the opening to seal off any unused opening.

5 Claims, 2 Drawing Sheets

FIG. 1
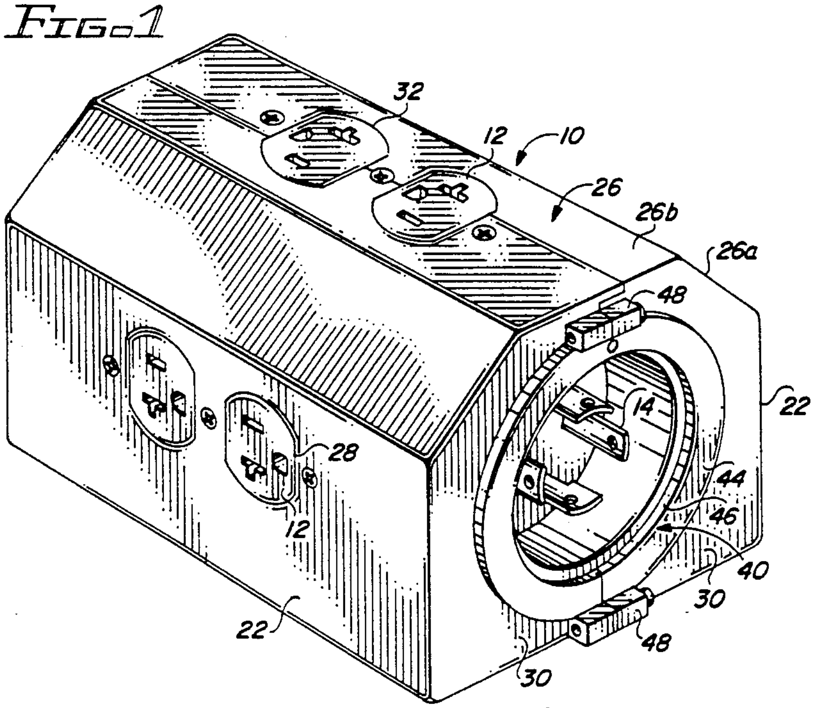
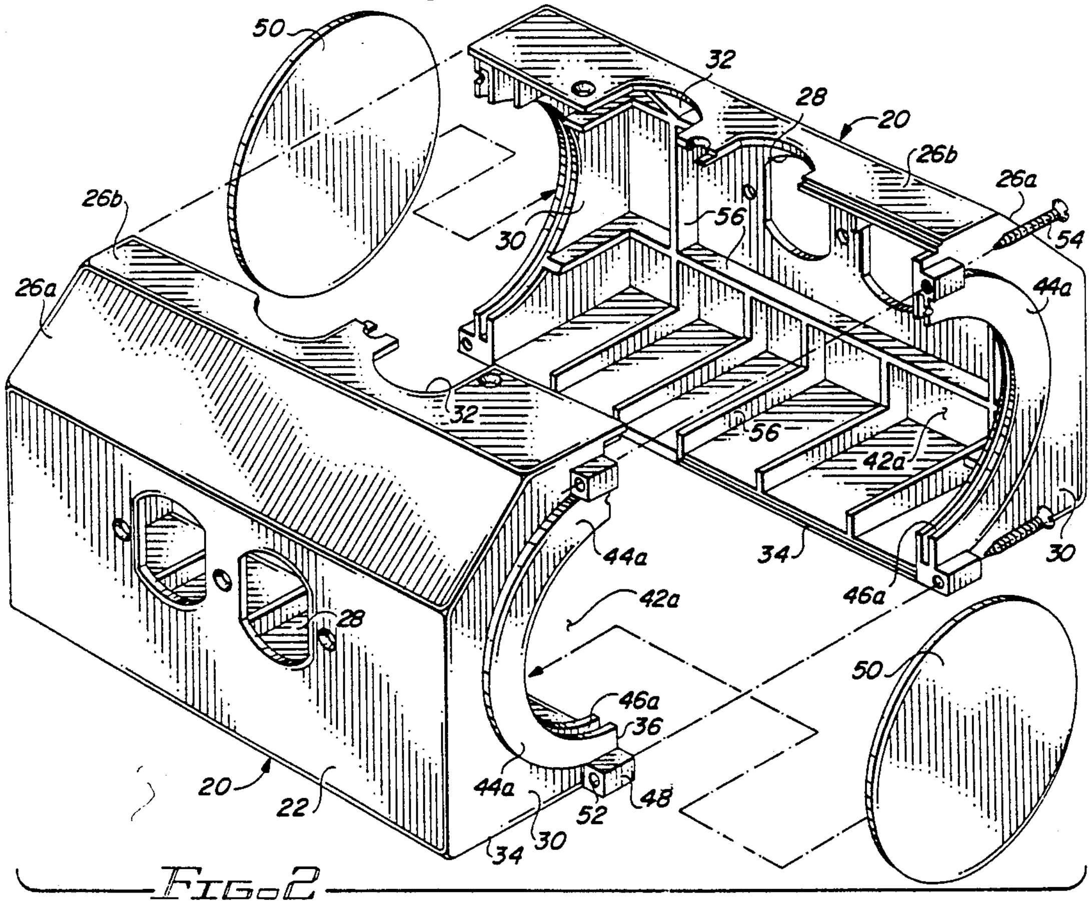
FIG. 2

FIG. 3
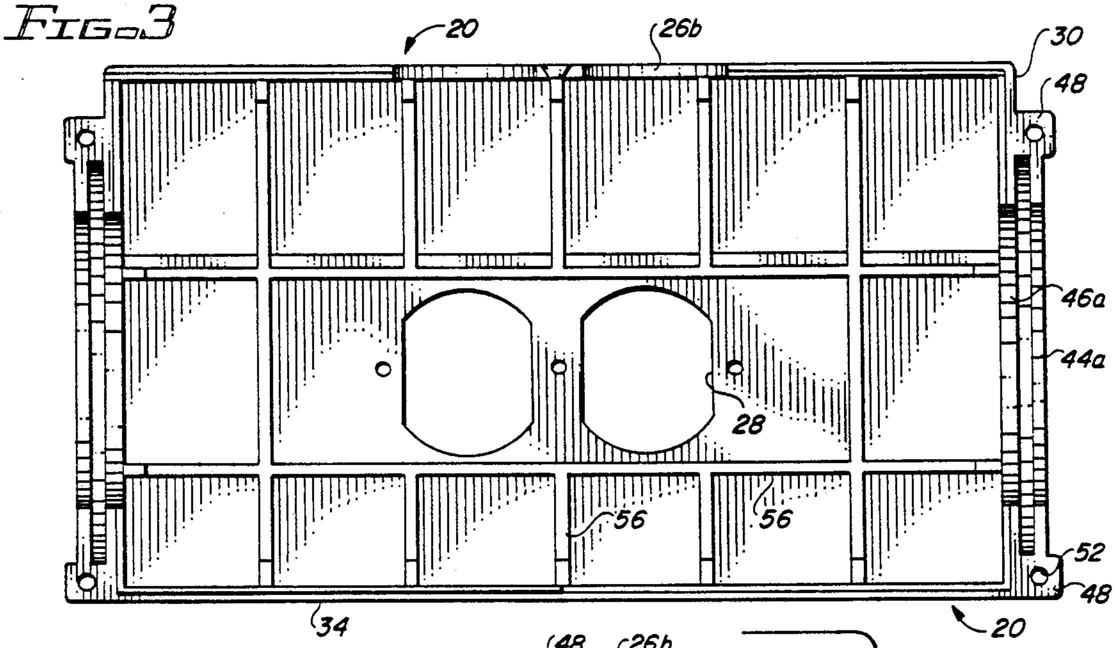
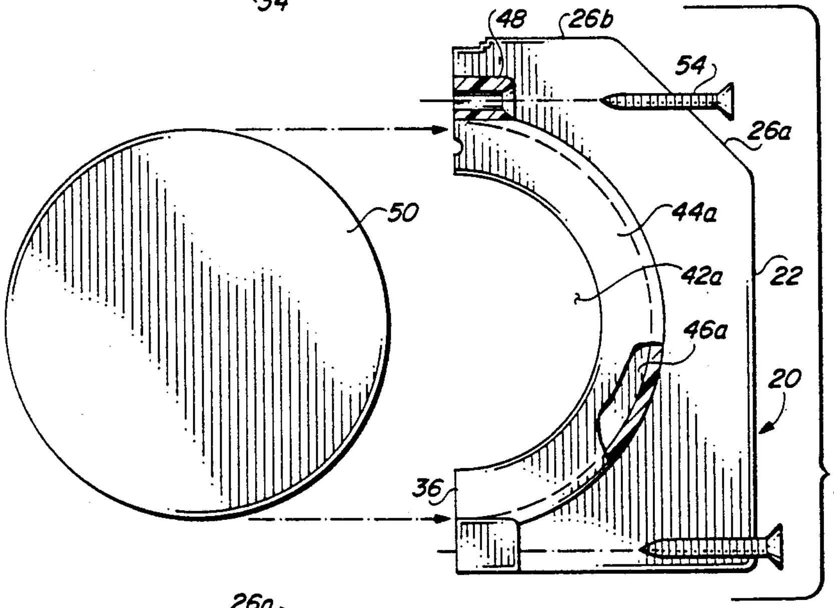
FIG. 5
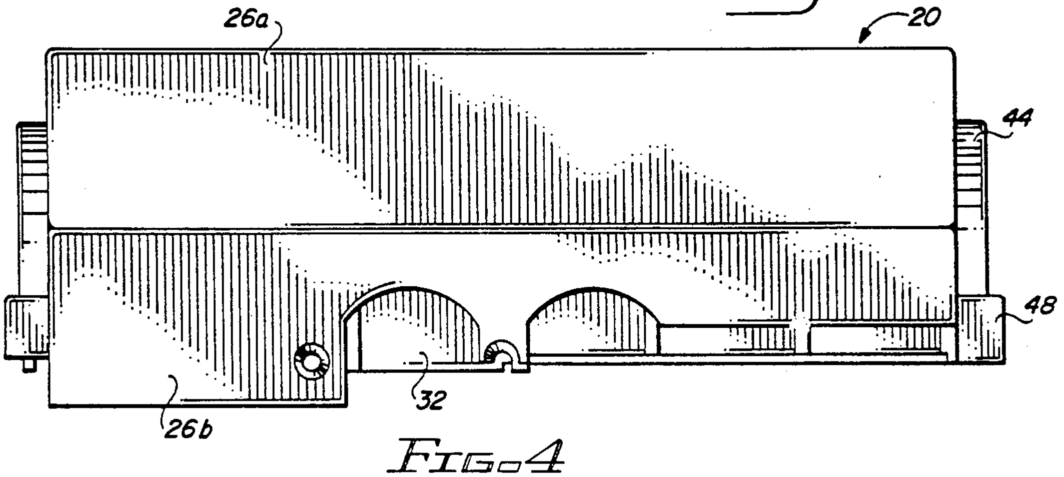
FIG. 4

RECEPTACLE BOX

FIELD OF THE INVENTION

This invention relates to improved boxes for use in the electrical arts, particularly to electrical receptacle or outlet boxes. More particularly this invention relates to such electrical boxes with resealable opening means for the entry and exit of power cables.

BACKGROUND OF THE INVENTION

For many years, trade shows and exhibitions have used what are termed "stringer" boxes to help deliver electrical power to the myriad of booths which are to be found at such shows and exhibits. Initially, such boxes can be described as a one-piece molded rubber junction box having thick walls with opposite ends of the box provided with hollow, nipple-like rubber extensions to receive the main power cable and with openings on opposed sides of the box to receive conventional electrical receptacles, switches and the like. A series of such boxes is usually mounted on a single power cable, each for delivery of power to one or more booths or exhibits. The wiring of even a single such early boxes to a power cable was both difficult and time consuming since the power cable needed to be pulled, usually with considerable difficulty, through the nipple-like extension at one end of the box, through the box and then through and out the opening at the opposite end of the box.

My U.S. Pat. No. 4,818,822 provides a junction or stringer box readily adapted to be installed on electrical power cable and which comprises interlocking box sections which may be joined together over the cable at any appropriate point to enclose the cable connections or in-line taps and to securely clamp the junction box to the cable. Such box, when constructed to be used as a stringer box, is made up of two identical sections and thus only a single cavity mold is needed to manufacture the box sections. The preferred material from which such boxes is made is an electrically non-conductive material such as PVC, ABS or a bisphenol A polycarbonate polymer, commercially available under the trademarks Lexan and Merlon.

The box of the aforementioned "822" patent is basically used in situations where a series of such boxes is mounted to a single power cable, which cable enters at one end of the box and exits at the opposite end. Although such boxes have proved to work extremely well, there is no provision in the box for sealing off an unused end of the box.

Moreover, many junction and outlet boxes used in electric wiring are provided with so-called knock-out plugs, which, when removed, provide an opening to allow for entry and exit of a power cable. Once such plugs have been removed, it is not possible to replace the plug.

SUMMARY OF THE INVENTION

This invention provides an improved electrical receptacle or outlet box which is readily adapted to be hooked up to a power cable and which provides resealable opening means for either the entry and/or exit of the power cable. As with the box of the "822" patent, a single box or series of boxes may be connected to a power supply. The box is made up of two sections, and preferably of an electrically non-conductive material such as PVC, ABS or a bisphenol A polycarbonate polymer. Although not required, in a most preferred embodiment, the box sections are identical which means only a single cavity mold is required to make the sections if formed from a plastic. Additionally, and as with the construction of the box of the "822" patent, the walls of the box sections are provided with ribbed construction which means that the side and end walls may be made considerably thinner, conserving materials and with improved structural integrity.

An important feature of the receptacle box of this invention is that at least one side of the box is provided with resealable opening means. That is, the receptacle box is provided with one or more sealed opening means which can be used to provide entry or exit of a power cable. When it is desired that a power cable enter the box, the two sections of the box are separated and the sealing means is removed providing an entry for the power cable. Thereafter the two sections are secured together. In a preferred embodiment, the receptacle box is provided with two such resealable openings which can provide for both entry and exit of the power cable. In a situation where only entry of a power cable is desired, the sealing means is removed from only one of the openings; where both entry and exit of a power cable is desired, then both sealing means are removed. With such construction, it is obvious that the box can be used and reused multiple times for many different applications.

DESCRIPTION OF THE DRAWINGS

FIG. 1 is a perspective view of a receptacle box showing a five-wire inlet flange receptacle mounted therein to accommodate a power cable and a pair of 110 volt outlet receptacles;

FIG. 2 is a perspective view of the two sections of the receptacle box;

FIG. 3 is a side elevational view of the interior section of the box;

FIG. 4 is a top plan view of one section of the box; and

FIG. 5 is a view of the end of one section of the box showing placement of the sealing means.

DESCRIPTION OF THE PREFERRED EMBODIMENT

Referring to the drawings, the numeral 10 of FIG. 1 denotes an assembled receptacle box, showing one end being provided with a resealable opening 40 in which has been mounted a 20 amp five-wire inlet flanged receptacle 14. The box 10 is also provided with three paired 110 volt outlet receptacles 12, only two of which can be seen in the view of FIG. 1. As shown best in FIG. 2, the box is formed of two sections 20 and in the illustrated embodiment the sections are identical. Edges of box sections 20 are brought together in abutment to form side walls 22, two end walls 30, bottom 34, and a top 26 which is formed of horizontal section **26*b* and angled section 26*a* which joins side wall 22 and top section 26*a*. As shown best in FIG. 2, each of the side walls 22 is provided with a pair of openings 28 to accommodate 110 volt outlet receptacle 12. Section 26*b* of top 26 is also provided with openings 32 to also receive a 110 volt outlet receptacle 12. As shown in FIGS. 2 and 3, the bottom, side walls and top of each section 20 of receptacle 10 are all reinforced by a series of spaced apart horizontal and vertical ribs 56** which are integrally molded into the walls and sections to improve structural integrity and conserve materials.

As shown, receptacle box 10 is provided with resealable opening means shown generally at 40 in FIG. 1 in both end walls 30. As shown best in FIGS. 2-5, each end wall 30 in the assembled box is provided with a generally circular opening 42; that is, the end wall of each box section 20 has a semi-circular opening 42*a* which extends from a mating edge 36 into the wall of the box and when the two sections are joined together, the generally circular opening 42 is formed. Surrounding the perimeter of opening 42 is a protruding rim or flange 44 and the area of the flange immediately adjacent to opening 42 is provided with channel 46. Thus, each box section 20 has a semi-circular flange 44*a* and a semicircular channel 46*a* and when the two sections are joined, a circular flange 44 having channel 46 which surrounds the periphery of opening 42 is the result. Channel 46 is adapted to receive a sealing means, circular shaped and planar disk 50. Flange area 44 is also provided with integral shoulders 48 each of which is provided with holes 52 to receive a self-tapping screw 54 or other fastener which is used to secure the two sections 20 together to form the unitary receptacle box 10. As shown best in FIG. 5, prior to assembling sections 20 to form the box 10, disk 50 is inserted into the semi-circular channel 46*a* of one of the box sections 20. Thereafter, the other box section 20 is brought into alignment with the first section and the remaining free edge of disk 50 are inserted into the channel 46*a* of the flange area of the other box section. The self-tapping screws are then inserted into holes 52 of shoulders 48 and the two sections are secured together.

Of course when a power cable is to be introduced into the receptacle box, sections 20 are separated, disk 50 is removed, and the power cable is introduced into the interior of the receptacle along with any other electrical equipment such as outlet receptacles 12. Thereafter the sections are reassembled.

In the embodiment shown in FIG. 1, a five-wire 220 volt inlet flange receptacle 14 is shown mounted in the resealable opening 40 of the box 10. This particular receptacle is of NEMA configuration and available from a number of manufacturers and is provided with a flange around the perimeter of the receptacle. This flange is received in the channel 46 of the flange 44 of the receptacle box 10 in the same manner as disk 50. Additionally, the various 110 volt outlets as shown in FIG. 1 are electrically connected to the five-wire receptacle 14. Although not shown, the opposite end of receptacle box 10 may also be provided with a five-wire 220 volt outlet flange receptacle also available from various manufacturers. As with the inlet receptacle 14, such outlet receptacle is also provided with flanges which engage in the channel area provided at the opposite end of the box 10.

Although the resealable opening means 40 shown in the embodiment described herein is circular in shape, with the corresponding flange and channels being circular, it will be appreciated that this resealable opening means may be provided in other shapes, for example, the opening could very well be square, hexagonal and the like. It will also be appreciated that most available electrical outlet boxes are provided with knock-out plugs which are useful in bringing a power cable into or out of the outlet box. Although such knock-out plugs are useful, once the plug has been removed from the wall of the box, it cannot be replaced. Thus, the receptacle box of this invention provides a construction which is an improvement to the use of knockout plugs and provides a very convenient way of resealing the openings to the receptacle box once the need for such an opening is no longer required.

Although the receptacle box described herein has a pair of resealable opening means, one at each end of the box, it will be appreciated that the box can have only one opening or multiple openings. Where multiple openings are desired they need not be on opposed wall of the box as described herein. Moreover, in the described embodiment, the circular opening 42 is formed from semicircular circular opening 42*a* in each box section. It is possible to provide an opening in the receptacle box which is contained totally within a wall of one of the box sections. Moreover, it may also be desirable to provide, perhaps as an accessory, a sealing disk with an opening in the center of disk to accommodate various mechanical cable connectors or strain releases commonly used in the electrical trade.

I claim:

1. An electrical receptacle box provided with an electrical apparatus mounted within said box, with said electrical apparatus having a flange about the periphery of one end thereof, said receptacle box being formed of a pair of separable box sections, each section having side walls and a pair of opposed end walls, said box sections having edges which mate together to form said box with at least one adjacent wall of each of said box sections provided with an opening extending from an edge of said box section end wall for a distance into said wall to form a single opening when said box sections are joined together, and a receiving means formed about the periphery of said opening with the flange of said apparatus engaged in said receiving means to anchor said apparatus within said box.

2. The electrical receptacle box of claim 1 wherein said receiving means is a channel.

3. The electrical receptacle box of claim 2 wherein each of said end walls is provided with an opening extending from an edge of said box section end wall for a distance into said wall to form a single opening when said box sections are joined together; with a channel formed about the periphery of each of said openings and wherein the flange of said apparatus is engaged in the channel of one of said openings.

4. The electrical receptacle of claim 3 wherein the remaining opening is provided with a planar shaped seal engaged in the channel of said remaining opening.

5. The electrical receptacle of claim 3 wherein said openings are circular and wherein each of said box sections is identical to the other.

* * * * *